(12) United States Patent
Granfors et al.

(10) Patent No.: US 8,605,862 B2
(45) Date of Patent: Dec. 10, 2013

(54) DIGITAL X-RAY DETECTOR WITH INCREASED DYNAMIC RANGE

(75) Inventors: Paul Richard Granfors, Berkeley, CA (US); John Robert Lamberty, Oconomowoc, WI (US); Richard Gordon Cronce, Waukesha, WI (US); Ping Xue, Pewaukee, WI (US); Marc Schaepkens, Clifton Park, NY (US); Aaron Judy Couture, Schenectady, NY (US); Douglas Albagli, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 565 days.

(21) Appl. No.: 12/891,016

(22) Filed: Sep. 27, 2010

(65) Prior Publication Data

US 2012/0074329 A1    Mar. 29, 2012

(51) Int. Cl.
*H05G 1/64*    (2006.01)
*G01T 1/24*    (2006.01)

(52) U.S. Cl.
USPC .................................. 378/98.8; 250/370.09

(58) Field of Classification Search
USPC .......................... 378/4, 19, 98, 8; 250/370.09
See application file for complete search history.

(56) References Cited

U.S. PATENT DOCUMENTS

| | | | |
|---|---|---|---|
| 5,789,737 A | 8/1998 | Street | |
| 6,721,441 B1 | 4/2004 | Granfors | |
| 6,868,138 B2 | 3/2005 | Clinthorne et al. | |
| 7,084,905 B1 | 8/2006 | Nayar et al. | |
| 7,263,167 B2 | 8/2007 | Walter et al. | |
| 7,532,703 B2 | 5/2009 | Du et al. | |
| 7,583,790 B2* | 9/2009 | Hoffman et al. | 378/98.8 |
| 7,606,346 B2 | 10/2009 | Tkaczyk et al. | |
| 7,606,347 B2 | 10/2009 | Tkaczyk et al. | |
| 2007/0035653 A1* | 2/2007 | Hong et al. | 348/340 |

* cited by examiner

*Primary Examiner* — Irakli Kiknadze
(74) *Attorney, Agent, or Firm* — Fletcher Yoder, P.C.

(57) ABSTRACT

In one embodiment, a digital X-ray detector is provided with a plurality of pixel regions. Each pixel region includes a first photodiode having a first area and a second photodiode having a second area equal to or smaller than the first area. The digital X-ray detector also includes a shielding structure that overlies the first and second photodiodes of each pixel region with the shielding structure shielding proportionally less of the first photodiode than of the second photodiode to provide the first photodiode with a first sensitivity and the second photodiode with a second sensitivity lower than the first sensitivity.

16 Claims, 5 Drawing Sheets

DIGITAL X-RAY DETECTOR WITH INCREASED DYNAMIC RANGE

BACKGROUND OF THE INVENTION

The subject matter disclosed herein relates to digital imaging systems, and particularly to increasing the dynamic range of digital X-ray detectors.

Digital X-ray imaging systems are becoming increasingly widespread for producing digital data which can be reconstructed into useful radiographic images. In current digital X-ray imaging systems, radiation from a source is directed toward a subject, typically a patient in a medical diagnostic application. A portion of the radiation passes through the patient and impacts a detector. The surface of the detector converts the radiation to light photons which are sensed. The detector is divided into a matrix of discrete picture elements or pixels, and encodes output signals based upon the quantity or intensity of the radiation impacting each pixel region. Because the radiation intensity is altered as the radiation passes through the patient, the images reconstructed based upon the output signals provide a projection of the patient's tissues similar to those available through conventional photographic film techniques.

Digital X-ray imaging systems are particularly useful due to their ability to collect digital data which can be reconstructed into the images required by radiologists and diagnosing physicians, and stored digitally or archived until needed. In conventional film-based radiography techniques, actual films were prepared, exposed, developed and stored for use by the radiologist. While the films provide an excellent diagnostic tool, particularly due to their ability to capture significant anatomical detail, they are inherently difficult to transmit between locations, such as from an imaging facility or department to various physician locations. The digital data produced by direct digital X-ray systems, on the other hand, can be processed and enhanced, stored, transmitted via networks, and used to reconstruct images which can be displayed on monitors and other soft copy displays at any desired location. Similar advantages are offered by digitizing systems which convert conventional radiographic images from film to digital data.

Despite their utility in capturing, storing and transmitting image data, digital X-ray systems are still overcoming a number of challenges. For example, X-ray systems may be employed for a range of different types of examination, including radiographic and fluoroscopic imaging. Among other distinctions, these two types of imaging examinations are characterized by significantly different radiation levels used to generate the image data. Specifically, radiographic images employ substantially higher radiation levels than fluoroscopic images. In a number of applications, it may be desirable to perform both types of imaging procedures sequentially to obtain different types of data. However, current digital X-ray systems may encounter difficulties in performing both fluoroscopic and radiographic imaging with the same detector. It should be noted that such detectors are used in a number of other applications and settings. For example, in addition to projection X-ray applications, digital X-ray detectors are used for computed tomography imaging as well as for tomosynthesis imaging. Moreover, such systems are increasingly used for parcel and baggage inspection, for security systems (e.g., airport security), screening systems, industrial part inspection, and so forth.

Specifically, current digital X-ray systems employ amorphous silicon detectors with arrays of photodiodes and thin film transistors beneath an X-ray scintillator. Incident X-rays interact with the scintillator to emit light photons which are absorbed by the photodiodes, creating electron-hole pairs. The diodes, which are initially charged with several volts of reverse bias, are thereby discharged in proportion to the intensity of the X-ray illumination. The thin film transistor switches associated with the diodes are then activated sequentially, and the diodes are recharged through charge sensitive circuitry, with the charge needed for this process being measured.

However, the dynamic range (i.e., minimum and maximum exposure) of the amorphous silicon detectors is limited by the amount of charge that can be integrated in each pixel at certain exposure levels. At high exposures, saturation may occur and the signals obtained may not be representative of the number of photons or the intensity of radiation impacting individual pixel regions of the detector surface. As a result, details may be lost in the reconstructed images. As mentioned above, some of these detectors perform both radiographic and fluoroscopic imaging. Detectors used in fluoroscopy typically need the highest possible conversion factor with the lowest possible electronic noise; however, these detectors tend to have maximum exposure levels below those desirable for radiographic operation. Thus, detectors used in both radiographic and fluoroscopic operations are generally compromised as to one of these imaging operations.

BRIEF DESCRIPTION OF THE INVENTION

In accordance with one embodiment, a digital X-ray detector is provided with a plurality of pixel regions. Each pixel region includes a first photodiode having a first area and a first sensitivity, and a second photodiode having a second area equal to or smaller than the first area and a second sensitivity lesser than the first sensitivity. The digital X-ray detector also includes enable circuitry coupled to the first and second photodiodes of each pixel region for enabling readout of the first and second photodiodes. The digital X-ray detector further includes readout circuitry coupled to the first and second photodiodes of each pixel region for reading out data from the first and second photodiodes.

In accordance with another embodiment, a digital X-ray detector is provided with a plurality of pixel regions. Each pixel region includes a first photodiode having a first area and a second photodiode having a second area equal to or smaller than the first area. The digital X-ray detector also includes a shielding structure that overlies the first and second photodiodes of each pixel region with the shielding structure shielding proportionally less of the first photodiode than of the second photodiode to provide the first photodiode with a first sensitivity and the second photodiode with a second sensitivity lower than the first sensitivity.

In accordance with a third embodiment, a digital X-ray system is provided with a source of X-ray radiation and a digital detector configured to receive radiation from the source after traversing a subject of interest. The detector has a plurality of pixel regions. Each pixel region includes a first photodiode having a first area and a first sensitivity, and a second photodiode having a second area equal to or smaller than the first area and a second sensitivity lesser than the first sensitivity.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1:
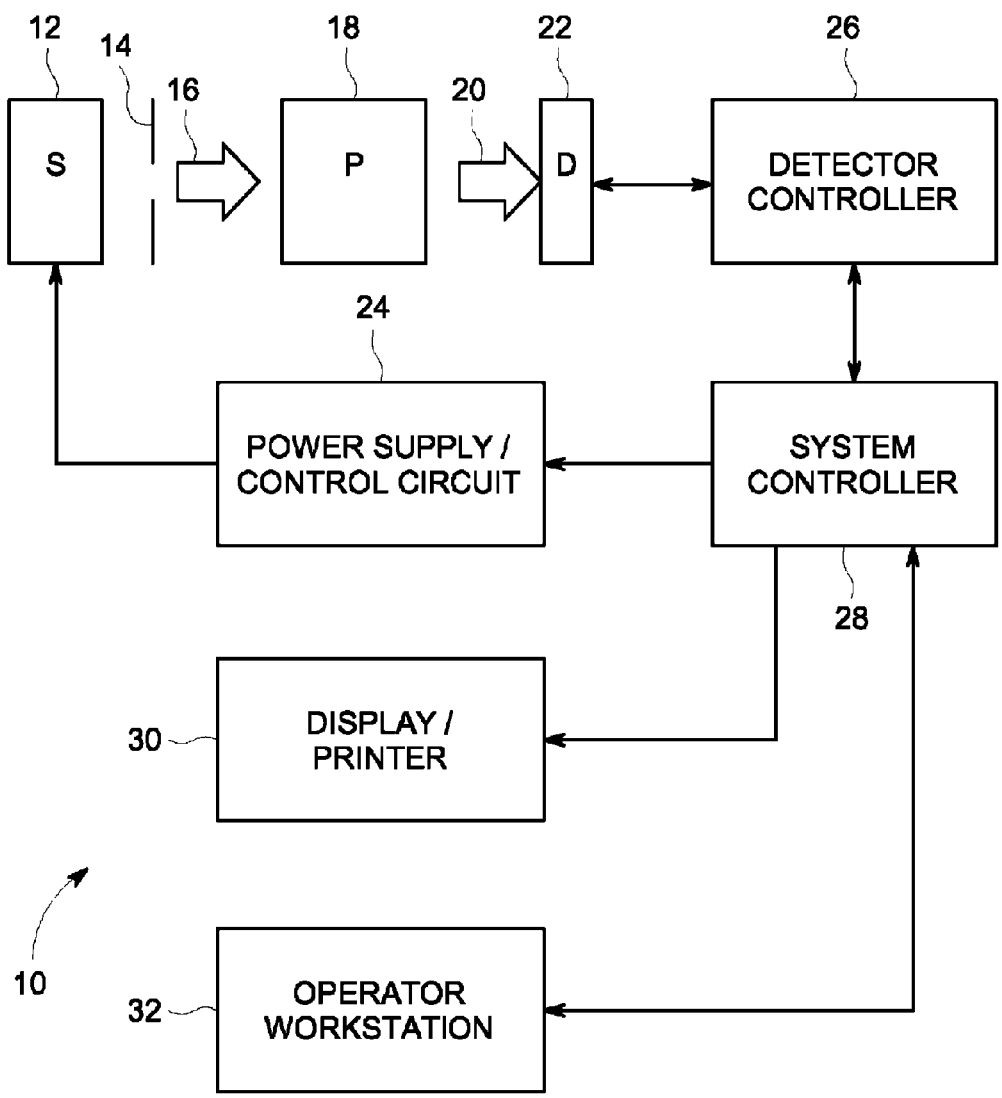
FIG. 1 is a diagrammatical overview of a digital X-ray imaging system, in accordance with aspects of the present technique.

FIG. 1 illustrates diagrammatically an imaging system 10 for acquiring and processing discrete pixel image data. In the illustrated embodiment, system 10 is a digital X-ray system designed both to acquire original image data, and to process the image data for display in accordance with the present technique. Throughout the following discussion, however, while basic and background information is provided on the digital X-ray system used in medical diagnostic applications, it should be born in mind that aspects of the present techniques may be applied to digital detectors, including X-ray detectors, used in different settings (e.g., projection X-ray, computed tomography imaging, tomosynthesis imaging, etc.) and for different purposes (e.g., parcel, baggage, vehicle and part inspection, etc.).

In the embodiment illustrated in FIG. 1, imaging system 10 includes a source of X-ray radiation 12 positioned adjacent to a collimator 14. Collimator 14 permits a stream of radiation 16 to pass into a region in which a subject 18, such as a human patient 18, is positioned. A portion of the radiation 20 passes through or around the subject 18 and impacts a digital X-ray detector, represented generally at reference numeral 22. As described more fully below, detector 22 converts the X-ray photons received on its surface to lower energy photons, and subsequently to electric signals which are acquired and processed to reconstruct an image of the features within the subject 18.

Source 12 is controlled by a power supply/control circuit 24 which furnishes both power and control signals for examination sequences. Moreover, detector 22 is coupled to a detector controller 26 which commands acquisition of the signals generated in the detector. Detector controller 26 may also execute various signal processing and filtration functions, such as for initial adjustment of dynamic ranges, interleaving of digital image data, and so forth. Both power supply/control circuit 24 and detector controller 26 are responsive to signals from a system controller 28. In general, system controller 28 commands operation of the imaging system to execute examination protocols and to process acquired image data. In the present context, system controller 28 also includes signal processing circuitry, typically based upon a general purpose or application-specific digital computer, associated memory circuitry for storing programs and routines executed by the computer, as well as configuration parameters and image data, interface circuits, and so forth. In the embodiment illustrated in FIG. 1, system controller 28 is linked to at least one output device, such as a display or printer as indicated at reference numeral 30. The output device may include standard or special purpose computer monitors and associated processing circuitry. One or more operator workstations 32 may be further linked in the system for outputting system parameters, requesting examinations, viewing images, and so forth. In general, displays, printers, workstations, and similar devices supplied within the system may be local to the data acquisition components, or may be remote from these components, such as elsewhere within an institution or hospital, or in an entirely different location, linked to the image acquisition system via one or more configurable networks, such as the Internet, virtual private networks, and so forth.

Figure 2:
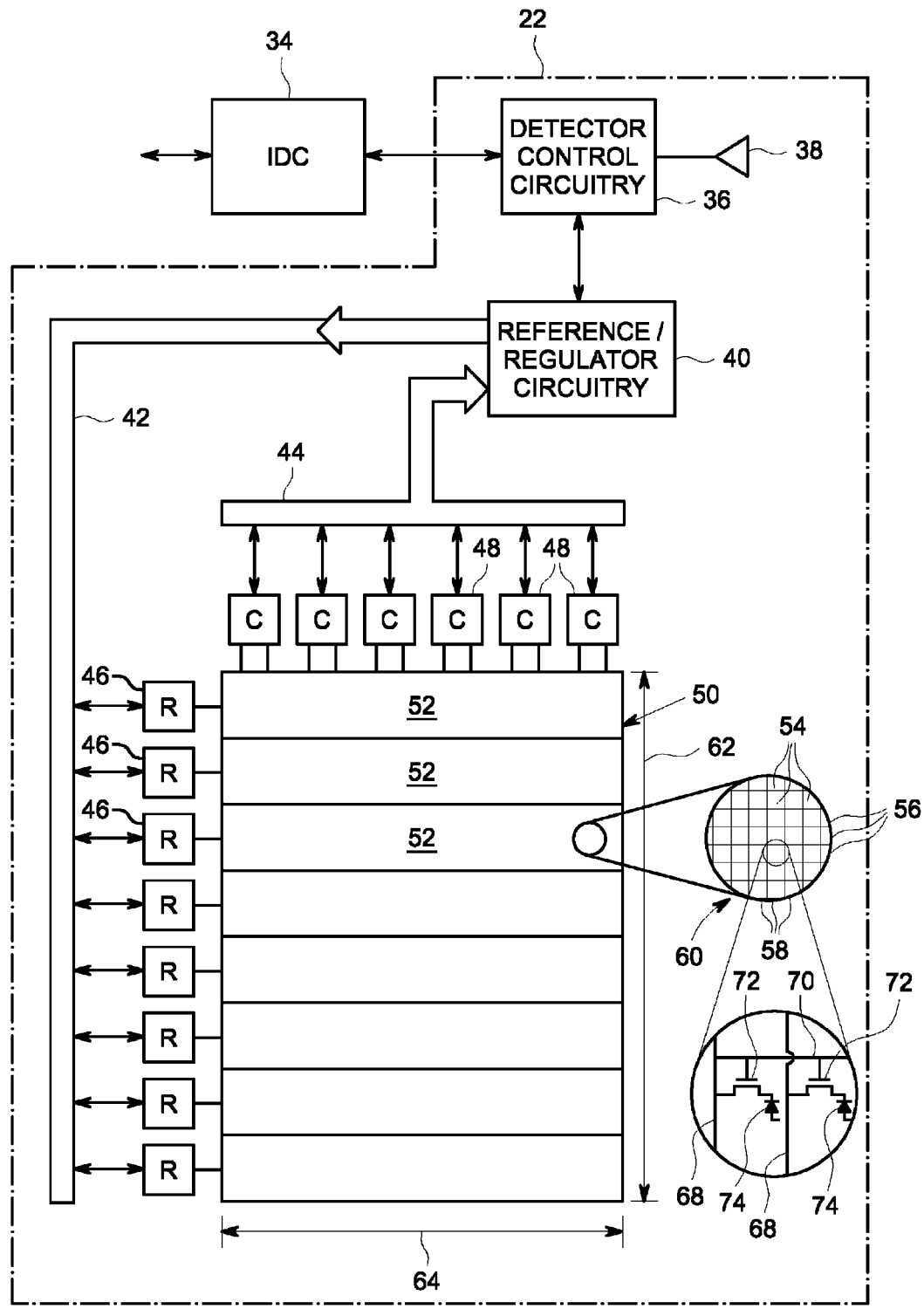
FIG. 2 is a diagrammatical representation of certain of the functional circuitry for producing image data in a detector of the system of FIG. 1 to produce image data for reconstruction.

FIG. 2 is a diagrammatical representation of functional components of digital detector 22. FIG. 2 also represents an imaging detector controller or IDC 34 which will typically be configured within detector controller 26. IDC 34 includes a CPU or digital signal processor, as well as memory circuits for commanding acquisition of sensed signals from the detector. IDC 34 is coupled to detector control circuitry 36 within detector 22. The IDC 34 may be coupled to the detector control circuitry 36 via cables (e.g., fiber optic cables) or wirelessly. IDC 34 thereby exchanges command signals for image data within the detector during operation.

Detector control circuitry 36 receives DC power from a power source, represented generally at reference numeral 38. Detector control circuitry 36 is configured to originate timing and control commands for row drivers and column readout circuits used to transmit signals during data acquisition phases of operation of the system. Circuitry 36 therefore transmits power and control signals to reference/regulator circuitry 40, and receives digital image pixel data from circuitry 40.

In a presently preferred embodiment illustrated, detector 22 consists of a scintillator that converts X-ray photons received on the detector surface during examinations to lower energy (light) photons. An array of photodetectors then converts the light photons to electrical signals which are representative of the number of photons or the intensity of radiation impacting individual pixel regions of the detector surface. As described below, readout electronics convert the resulting analog signals to digital values that can be processed, stored, and displayed, such as in a display 30 or a workstation 32 following reconstruction of the image. In a presently preferred embodiment, the array of photodetectors is formed on a single base of amorphous silicon. The array elements or pixel regions are organized in rows and columns, with each pixel region consisting of first and second photodiodes. Each photodiode has an associated thin film transistor. The cathode of each diode is connected to the source of the transistor, and the anodes of all diodes are connected to a negative bias voltage. The gates of the transistors in each row are connected together and the row electrodes are connected to the scanning electronics described below. The drains of the transistors in a column are connected together and an electrode of each column is connected to readout electronics.

In the particular embodiment illustrated in FIG. 2, by way of example, a row bus 42 includes a plurality of conductors for enabling readout from various columns of the detector, as well as for disabling rows and applying a charge compensation voltage to selected rows, where desired. A column bus 44 includes additional conductors for reading out the columns while the rows are sequentially enabled. Row bus 42 is coupled to enable circuitry or a series of row drivers 46, each of which commands enabling of a series of rows in the detector. Similarly, readout circuitry 48 is coupled to column bus 44 for reading out all columns of the detector.

In the illustrated embodiment, row drivers 46 and readout circuitry 48 are coupled to a detector panel 50 which may be subdivided into a plurality of sections 52. Each section 52 is coupled to one of the row drivers 46, and includes a number of rows. Similarly, each column module 48 is coupled to a series of columns. The photodiode and thin film transistor arrangement mentioned above thereby define a series of pixel regions or discrete picture elements 54 which are arranged in rows 56 and columns 58. The rows and columns define an image matrix 60, having a height 62 and a width 64.

As also illustrated in FIG. 2, each photodiode of each pixel region 54 is generally defined at a row and column crossing, at which a row electrode or scan line 68 crosses a column electrode or data line 70. As mentioned above, a thin film transistor 72 is provided at each crossing location for each photodiode of each pixel region 54. As each row 56 is enabled by row drivers 46, signals from each photodiode 74 may be accessed via readout circuitry 48, and converted to digital signals for subsequent processing and image reconstruction.

Figure 3:
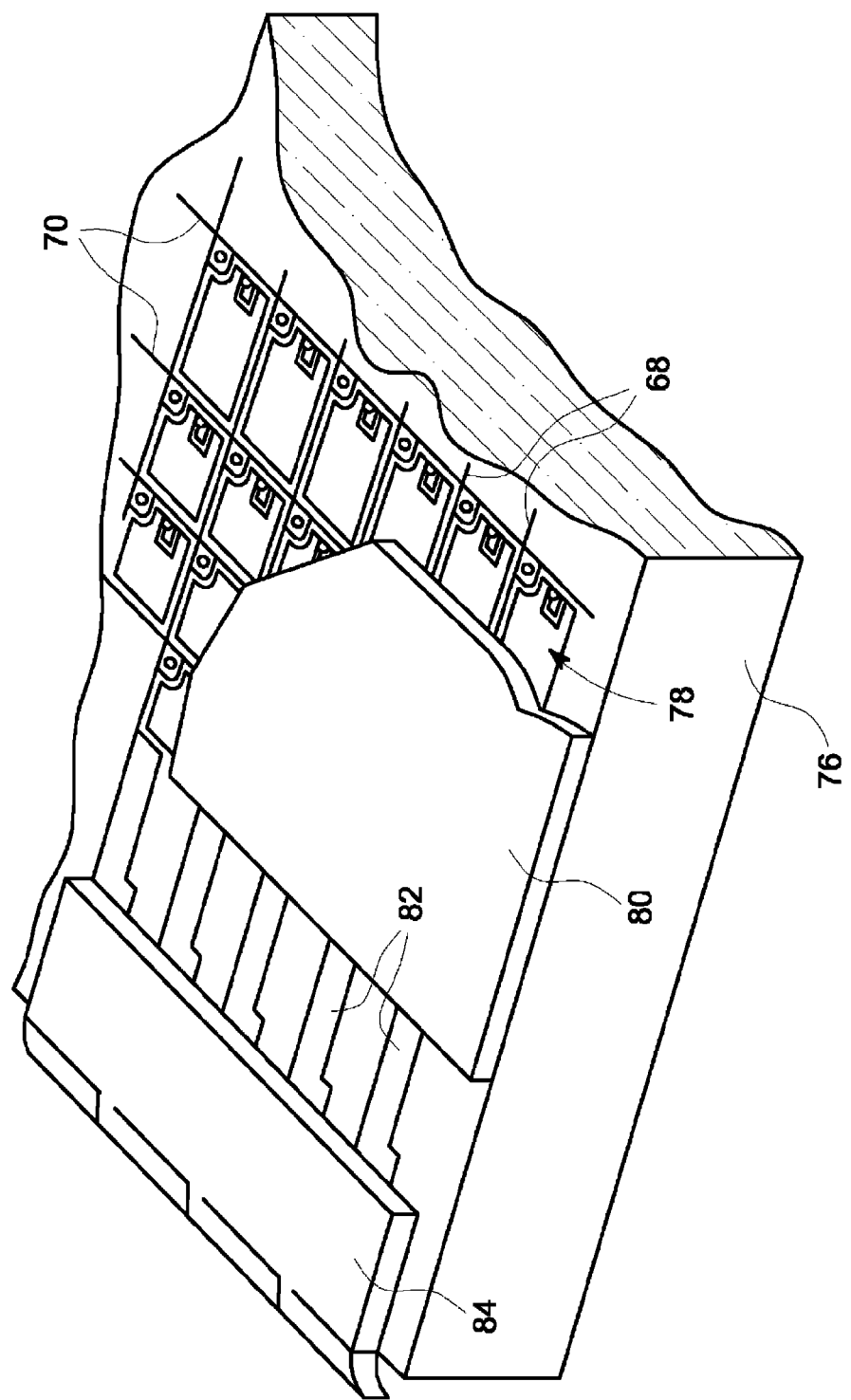
FIG. 3 is a partial sectional view illustrating a detector structure for producing image data.

FIG. 3 generally represents a physical arrangement of the components illustrated diagramatically in FIG. 2. As shown in FIG. 3, the detector may include a glass substrate 76 on which the components described below are disposed. Row electrodes 70 and column electrodes 68 are provided on the substrate, and an amorphous silicon flat panel array 78 is defined, including the thin film transistors and photodiodes described above. A scintillator 80 is provided over the amorphous silicon array 78 for receiving radiation during examination sequences as described above. Contact fingers 82 are formed for receiving signals from the column electrodes 68, and contact leads 84 are provided for communicating the signals between the contact fingers 82 and external circuitry.

It has been found that in systems employing detectors with amorphous silicon flat panel arrays 78 that the dynamic range of the detectors is limited by the amount of charge that can be integrated in each pixel region at certain exposure levels. The maximum (i.e., limited by diode saturation) and minimum exposures (i.e., limited by noise levels) of each pixel region determine the dynamic range of the detector. The capacitance of the photodiode and the conversion factor or gain of the pixel region determine the maximum exposure of each pixel region. The ratio of electronic noise to conversion factor determines the minimum exposure of each pixel region. At high exposures, saturation may occur and the signals obtained may not be representative of the number of photons or the intensity of radiation impacting individual pixel regions of the detector surface. As a result, details may be lost in the reconstructed images. Some of these detectors perform both radiographic and fluoroscopic imaging. Detectors used in fluoroscopy typically need the highest possible conversion factor with the lowest possible electronic noise; however, these detectors tend to have maximum exposure levels below those desirable for radiographic operation. Thus, detectors used in both radiographic and fluoroscopic operations are generally compromised as to one of these operations.

Figure 4:
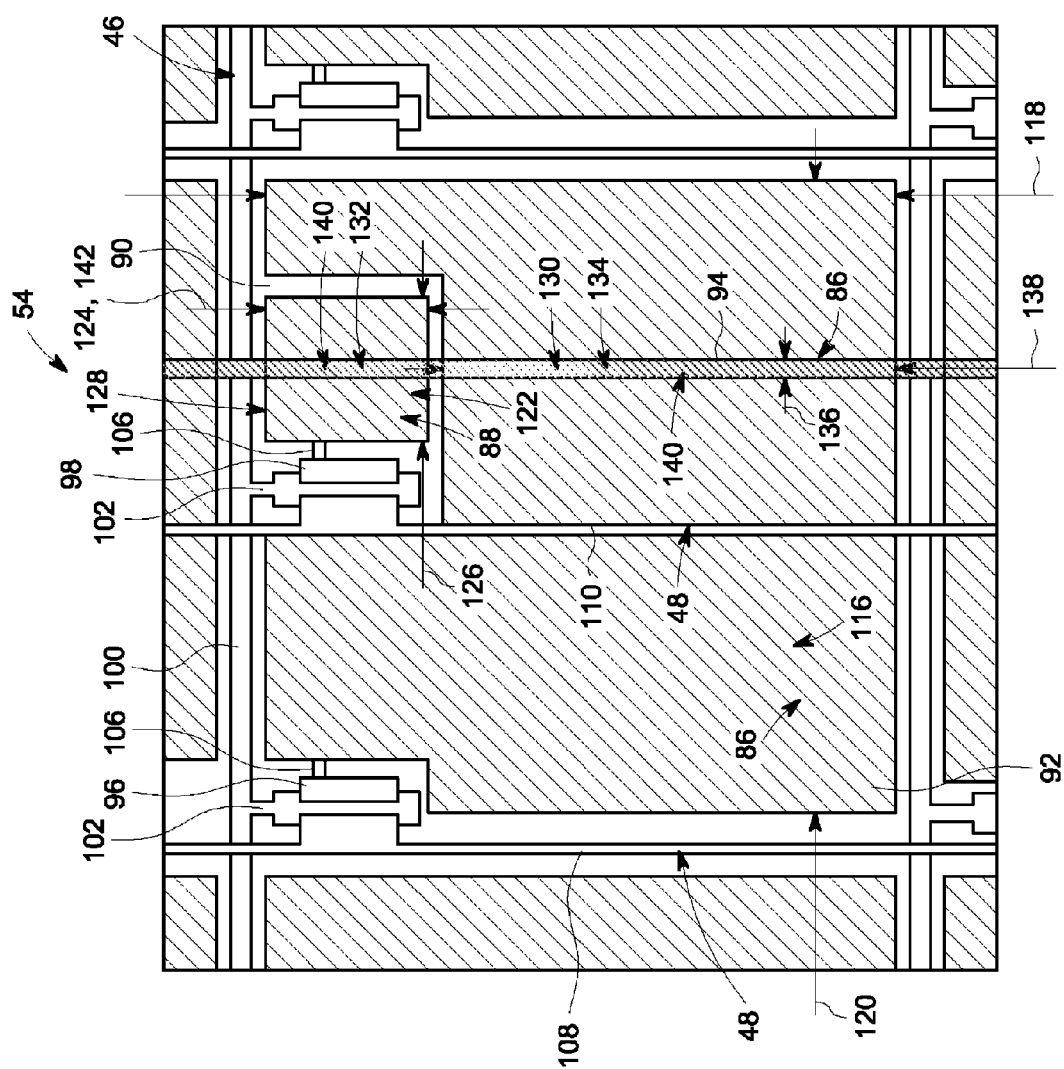
FIG. 4 is a top view illustrating a pixel structure in the detector structure of FIG. 3.

The present technique provides a mechanism for allowing a higher maximum exposure level, while minimally affecting the minimum exposure level. FIG. 4 illustrates an embodiment of pixel region 54 to increase the dynamic range of the detector. The pixel region 54 includes a first photodiode 86 and a second photodiode 88 separated by a gap 90. An overlayer 92 covers both photodiodes 86 and 88. The overlayer 92 may be made of indium tin oxide. The overlayer 92 is maintained at a biased voltage (e.g., −9V). A structure 94 maintains the overlayer 92 at a biased voltage. The structure 94 includes an electrode 94 common to the first and second photodiodes 86 and 88 of each pixel region 54. The common electrode 94 may be made of aluminum or some other conductor. The first photodiode 86 is coupled to a first transistor 96 for reading out data. Also, the second photodiode 88 is coupled to a second transistor 98 for reading out data. In certain embodiments, the transistors 96 and 98 are field-effect transistors. The first and second transistors 96 and 98 are coupled to and share a scan line 100 via connections 102. The scan line 100 forms part of the enable circuitry 46. In addition, the transistors 96 and 98 are coupled to a bottom electrode (not shown) via connections 106. The photodiodes 86 and 88 are initially charged by setting the gates of transistors 96 and 98 to a positive voltage by setting the scan line 100 to a positive voltage. The photodiodes 86 and 88 are then isolated by setting the gates of the transistors 96 and 98 to a negative voltage. Then the detector is exposed to x-rays. The x-rays are converted to light by the scintillator, and the light impinges on the photodiodes 86 and 88. The charge of the photodiodes 86 and 88 is depleted as light photons impact them generating electron hole pairs. In order to read the signals from the photodiodes 86 and 88, the transistors 96 and 98 are turned on by pulsing the scan line 100 with a positive voltage and the signals acquired via data lines 108 and 110. The data lines 108 and 110 form part of the readout circuitry 48. The first transistor 96 is coupled to a first data line 108, while the second transistor 98 is separately coupled to a second data line 110. The enable circuitry 46 and the readout circuitry 48 are configured to provide readout of the first and second photodiodes 86 and 88 of each pixel region 54. Indeed, with the separate data lines 108 and 110, the enable circuitry 46 and the readout circuitry 48 are also configured to provide separate readout of the first and second photodiodes 86 and 88 of each pixel region 54.

The first photodiode 86 has a first area 116 generally defined by a first height 118 and a first width 120 minus area 122 of the second photodiode 88. The second photodiode 88 has a second area 122 generally defined by a second height 124 and a second width 126. The area 116 of the first photodiode 86 may range from 0.0025 to 0.1 mm$^2$. The area 122 of the second photodiode 88 may range from 1% to 100% of the area of the first photodiode 86. The area 122 of the second photodiode 88 is equal to or smaller than the area 116 of the first photodiode 86. The area 116 of the first photodiode 86 may be approximately 1 to 100 times the area 122 of the second photodiode 88. As illustrated, the second photodiode 88 is rectilinearly shaped and located at a centrally located top portion 128 of the pixel region 54. In certain embodiments, the second photodiode 88 may have a different shape and/or be located at a different region of the pixel region 54.

In addition, the first photodiode 86 has a first sensitivity and the second photodiode 88 has a second sensitivity. The sensitivity of the second photodiode 88 is less than the sensitivity of the first photodiode 86. The structure 94 overlies the first and second photodiodes 86 and 88 of each pixel region 54 to provide the respective sensitivities to the first and second photodiodes 86 and 88 of each pixel region 54. The structure 94 traverses and covers a first part 130 of the first photodiode 86 and a second part 132 of a second photodiode 88 to block these parts 130 and 132 from radiation (i.e., optical radiation or light) and to act as a shielding structure 94. The structure 94 shields proportionally less of the first photodiode 86 than the second photodiode 88, thus the second photodiode 88 has a lower sensitivity than the first photodiode 86. More specifically, the structure 94 has a first portion 134 that covers the first part 130 of the first photodiode 86 defined by a width 136 and a height 138 (i.e., approximately the height 118 of the first photodiode 86 minus the height 124 of the second photodiode 88) of the first portion 134. The structure 94 has a second portion 140 that covers the second part 132 of the second photodiode 88 defined by the width 136 and a height 142 (i.e., same as height 124 of the second photodiode 88) of the second portion 140. The masked or shielded first part 130 may range from approximately 1 percent to 10 percent of the area 116 of the first photodiode 86. For example, the first portion 134 of the structure 94 may shield or mask 2 percent of the area 116 of the first photodiode 86. The masked or shielded second part 132 may range from approximately 10 percent to 80 percent. For example, the second portion 140 of the structure 94 may shield or mask 50 percent of the area 122 of the second photodiode 88.

Although we have described the mechanism for making the sensitivities of the two diodes different as being use of a shielding structure, it should be noted that other means are possible. For example, the structures of the diodes may be made different to achieve the desired sensitivities. In particular a partially absorbing film, e.g. the p+, n+ or intrinsic silicon layer of the diode, could be made different for the two diodes to make their sensitivities different.

These different sensitivities as well as the ability for separate readouts for the photodiodes 86 and 88 allow the detector 22 to have a greater dynamic range. As mentioned above, the imaging system 10 includes circuitry for processing the signals obtained from the pixel regions 54 of the detector 22. More specifically, the detector 22 (e.g., detector control circuitry 36 or other component of detector 22), IDC 34, and/or system controller 28 include processing circuitry configured selectively to process data from the first photodiode 86 combined with data from the second photodiode 88 of each pixel region 54. For example, during radiographic or fluoroscopic operations at lower exposure levels both the first and second photodiodes 86 and 88 may each generate a signal. The processing circuitry may combine these signals to obtain a signal value for each pixel region 54. Also, the processing circuitry is configured selectively to process data from the first photodiode 86 separately from data from the second photodiode 88 of each pixel region 54. For example, during operations at higher exposure levels the first photodiode 86 may saturate. The processing circuitry may then use the signal obtained from the second photodiode 88 as the signal value for each pixel region 54. In certain embodiments, the processing circuitry may combine the signals obtained from both the photodiodes 86 and 88 during operation at higher exposure levels. In some embodiments, the processing circuitry may also use either the signal from the first photodiode 86 or the signal from the second photodiode 88, instead of combining the signals, for the signal value of each pixel region 54 during operations at lower exposure levels. The advantage of the arrangement of the photodiodes 86 and 88 with different sensitivities and separate readouts provides the first photodiode 86 with a better signal to noise ratio during operations at lower exposure levels, while providing a signal value from the second photodiode 88 when the first photodiode 86 saturates.

Figure 5:
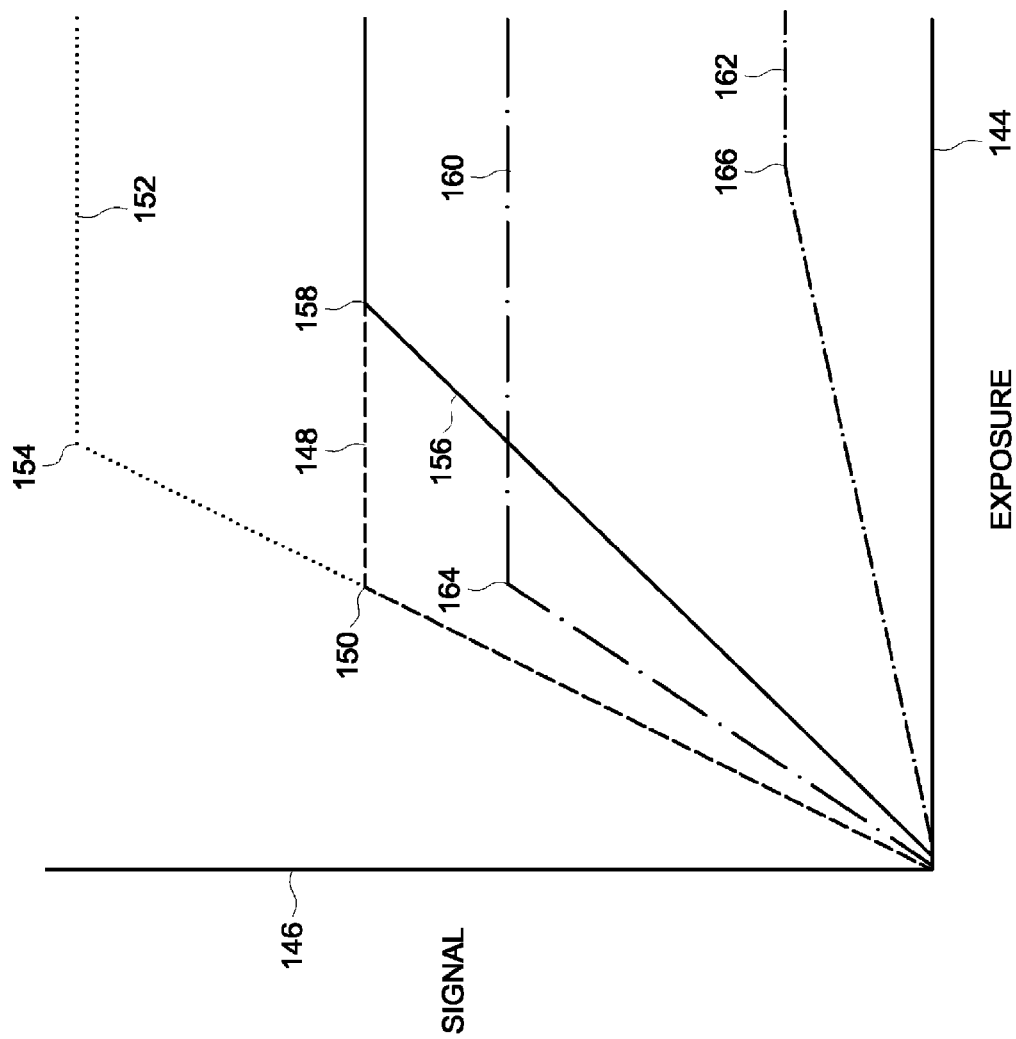
FIG. 5 is a graphical representation of signal levels for various pixel structures in relation to exposure levels, in accordance with aspects of the present technique.

FIG. 5 further illustrates the advantage of having two photodiodes with different sensitivities. FIG. 5 graphically represents signal levels for various pixel structures in relation to exposure levels. In FIG. 5, exposure level is represented along a horizontal axis 144, with the signal level being indicated generally by a vertical axis 146. Line 148 represents a single photodiode pixel region. At a certain level of exposure, indicated at point 150, the signal level for single photodiode pixel region 148 reaches the capacitance times the bias of the photodiode and becomes saturated. A single photodiode pixel region with higher capacitance, represented by line 152, only raises the ceiling of the capacitance times bias and increases the exposure level and signal level at which the pixel region reaches saturation, indicated at point 154. In addition, increasing the capacitance of the pixel region 152 increases the noise associated with the pixel region 152 which increases the minimum exposure. Alternatively, the conversion factor or gain for the single photodiode pixel may be lowered as represented by line 156. However, this does not change the capacitance times bias, i.e., the signal level where saturation occurs, indicated at point 158. Instead, lowering the conversion factor increases the exposure level to achieve saturation. Further, lowering the conversion factor also increases the ratio of noise to conversion factor associated with the pixel region 156 and, thus, the minimum exposure.

However, an embodiment of the pixel region with first and second photodiodes, as described above, helps overcome the above obstacles. As illustrated, the first photodiode of the pixel region, represented by line 160, and the respective second photodiode, represented by line 162, together have the same capacity of the single photodiode pixel region 148. As will be appreciated by those skilled in the art, in practice, the pixel region with two photodiodes may have a different capacitance from the single photodiode pixel region. As described above, the first photodiode has an equal or greater area as well as a greater sensitivity than the second photodiode. At a certain level of exposure, indicated at point 164, the signal level for the first photodiode 160 reaches the capacitance times the bias of the photodiode and becomes saturated, similar to the single photodiode pixel region 148. However, the pixel region with two photodiodes also includes the signal obtained from the second photodiode 162. The second photodiode 162 obtains saturation at a lower signal level, indicated at point 166, but at a much higher exposure level. Thus, as described above and illustrated by FIG. 5, at lower exposures, signals 160 and 162 may be obtained from both the first and second photodiodes of the pixel region, while at higher exposures, despite saturation at the first photodiode, a signal 162 may be obtained from the second photodiode of the pixel region.

Technical effects of the disclosed embodiments include providing multiple pixel regions each with two photodiodes having different areas and sensitivities. Embodiments of the pixel regions include structures to shield parts of both the photodiodes to impart different sensitivities to the two photodiodes. In addition, the enabling and readout circuitries allow separate readout from the two photodiodes. Further, processing circuitry may separately combine the signals to obtain a signal value at lower exposures, but only use the signal from the less sensitive photodiode at higher exposures if the more sensitive photodiode becomes saturated. Thus, pixel regions with the two photodiodes allow the dynamic range of the detector to be increased, while increasing the range of applications for the detector.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:
1. A digital X-ray detector comprising:
    a plurality of pixel regions, each pixel region comprising a first photodiode having a first sensitivity, and a second photodiode having a second sensitivity lesser than the first sensitivity;

enable circuitry coupled to the first and second photodiodes of each pixel region for enabling readout of the first and second photodiodes;

readout circuitry coupled to the first and second photodiodes of each pixel region for reading out data from the first and second photodiodes;

wherein each pixel region is traversed by a structure, and wherein the structure covers a first part of the first photodiode and a second part of the second photodiode, and wherein the structure shields the first and second parts from optical radiation, and wherein the structure comprises an electrode common to the first and second photodiodes of each pixel region.

2. The detector of claim 1, wherein the first photodiode has a first area, and the second photodiode has a second area smaller than the first area.

3. The detector of claim 1, wherein the structure shields proportionally less of the first photodiode than of the second photodiode to provide the first and second sensitivities.

4. The detector of claim 1, wherein the enable circuitry and the readout circuitry are configured to provide separate readout of the first and second photodiodes of each pixel region.

5. The detector of claim 4, comprising processing circuitry configured selectively to process data from the first photodiode of each pixel region separately from data from the respective second photodiode, and to process data from the first photodiode of each pixel region combined with data from the respective second photodiode.

6. The detector of claim 4, wherein each pixel region comprises a first transistor for reading out data from the first photodiode and a second transistor for reading out data from the second photodiode.

7. A digital X-ray detector comprising:

a plurality of pixel regions, each pixel region comprising a first photodiode having a first area and a second photodiode having a second area smaller than the first area; and a shielding structure that overlies the first and second photodiodes of each pixel region, the shielding structure shielding proportionally less of the first photodiode than of the second photodiode to provide the first photodiode with a first sensitivity and the second photodiode with a second sensitivity lower than the first sensitivity.

8. The detector of claim 7, wherein the shielding structure comprises an electrode common to the first and second photodiodes of each pixel region.

9. The detector of claim 7, comprising enable circuitry configured to enable readout of the first and second photodiodes of each pixel region, and readout circuitry configured to read out the first and second photodiodes of each pixel region.

10. The detector of claim 9, wherein the enable circuitry and the readout circuitry are configured to provide separate readout of the first and second photodiodes of each pixel region.

11. The detector of claim 10, wherein each pixel region comprises a first transistor for reading out data from the first photodiode and a second transistor for reading out data from the second photodiode.

12. The detector of claim 10, comprising processing circuitry configured selectively to process data from the first photodiode of each pixel region separately from data from the respective second photodiode, and to process data from the first photodiode of each pixel region combined with data from the respective second photodiode.

13. A digital X-ray system comprising:

a source of X-ray radiation;

a digital detector configured to receive radiation from the source after traversing a subject of interest, the detector having a plurality of pixel regions, each pixel region comprising a first photodiode having a first area and a first sensitivity, and a second photodiode having a second area smaller than the first area and a second sensitivity lesser than the first sensitivity;

wherein each pixel region is traversed by a structure, and wherein the structure covers a first part of the first photodiode and a second part of the second photodiode, and wherein the structure shields the first and second parts from optical radiation, and wherein the structure comprises an electrode common to the first and second photodiodes of each pixel region.

14. The system of claim 13, comprising enable circuitry configured to enable readout of the first and second photodiodes of each pixel region, and readout circuitry configured to read out the first and second photodiodes of each pixel region.

15. The system of claim 14, wherein the enable circuitry and the readout circuitry are configured to provide separate readout of the first and second photodiodes of each pixel region.

16. The system of claim 15, wherein each pixel region comprise a first transistor for reading out data from the first photodiode and a second transistor for reading out data from the second photodiode.

\* \* \* \* \*